: US008836268B2

(12) United States Patent
Yoshida

(10) Patent No.: US 8,836,268 B2
(45) Date of Patent: Sep. 16, 2014

(54) POSITION SENSING DEVICE, ROTATIONAL ACTUATOR HAVING THE SAME, SHIFT-BY-WIRE SYSTEM HAVING THE ROTATIONAL ACTUATOR, AND METHOD FOR DETECTING POSITION OF MOVABLE MEMBER

(75) Inventor: Takuya Yoshida, Kariya (JP)

(73) Assignee: Denso Corporation, Kariya (JP)

( * ) Notice: Subject to any disclaimer, the term of this patent is extended or adjusted under 35 U.S.C. 154(b) by 260 days.

(21) Appl. No.: 13/600,286

(22) Filed: Aug. 31, 2012

(65) Prior Publication Data

US 2013/0076290 A1     Mar. 28, 2013

(30) Foreign Application Priority Data

Sep. 28, 2011   (JP) ................... 2011-212527

(51) Int. Cl.
*G05B 1/06* (2006.01)
*H03M 1/10* (2006.01)
*H03M 1/64* (2006.01)
*G01D 5/244* (2006.01)

(52) U.S. Cl.
CPC .......... *G01D 5/24476* (2013.01); *H03M 1/645* (2013.01); *G01D 5/24428* (2013.01); *H03M 1/1076* (2013.01)
USPC . 318/652; 318/400.14; 318/603; 318/400.13; 318/400.21; 318/466; 701/55; 701/62; 701/64; 701/95; 701/29.7; 477/123; 477/125; 477/34; 477/107; 477/109; 123/90.18; 361/23

(58) Field of Classification Search
CPC ............ F16H 61/12; F16H 2061/1208; F16H 2061/1232; F16H 1/16; F16H 61/0213; F16H 63/42; F16H 59/44; F16H 2059/6807; F16H 61/143; F16H 61/14; F16H 59/70; F16H 59/40; F16H 61/70; F16H 61/0206; F16H 61/0437; F16H 61/061; B60W 10/06; B60W 2710/0605; B60K 31/047; B60K 31/107; B60K 2741/065; H02P 6/142; H02P 6/06; H02P 6/08; H02P 6/085; H02P 6/145; H01F 38/18; G01D 5/2073; G01D 5/2086; G01P 15/003; G01P 15/005
USPC ..................... 318/652, 400.14, 292, 603, 466; 123/198 F, 339.22, 339.17, 361, 396, 123/90.16, 170; 172/2, 4, 7, 3, 50; 180/306, 180/224, 282, 65.25, 65.265; 307/12, 82; 477/107, 111, 73, 78, 74, 75, 34, 109; 74/335; 701/29.7; 361/23
See application file for complete search history.

(56) References Cited

U.S. PATENT DOCUMENTS 5,665,027 A * 9/1997 Oba et al. ................ 477/109
8,340,859 B2 * 12/2012 Ito et al. ................ 701/29.7

(Continued)

FOREIGN PATENT DOCUMENTS

| JP | 1223311 A | 9/1989 |
| JP | 02-147814 A | 6/1990 |
| JP | 2009-092081 A | 4/2009 |

OTHER PUBLICATIONS

Office Action issued Jul. 19, 2013 in corresponding JP Application No. 2011-212527 (with English translation).

*Primary Examiner* — Shawki S Ismail
*Assistant Examiner* — Jorge L Carrasquillo

(57) ABSTRACT

A pulse signal output unit sends three-phase pulse signals according to movement of the movable member. A counter unit adds a first predetermined value or a second predetermined value to a count value or subtracts the first predetermined value or the second predetermined value from the count value, according to a combination of the pulse signals appearing when all the pulse signals are normal and a combination of the pulse signals appearing when one of the pulse signals malfunctions. A position detection unit detects the position of the movable member according to the count value.

4 Claims, 7 Drawing Sheets

(56) References Cited

U.S. PATENT DOCUMENTS

2002/0115527 A1* 8/2002 Miyata et al. ................... 477/34
2007/0087896 A1* 4/2007 Matsuzaki et al. ............ 477/107
2007/0182353 A1* 8/2007 Kamio et al. ................. 318/466
2009/0091866 A1* 4/2009 Inoue et al. ..................... 361/23

* cited by examiner

| PATTERN | PHASE A | PHASE B | PHASE C | |
|---------|---------|---------|---------|---|
| 1 | H | L | L | |
| 2 | H | H | L | |
| 3 | H | H | H | IN-NORMAL |
| 4 | L | H | H | |
| 5 | L | L | H | |
| 6 | L | L | L | |
| 7 | L | H | L | IN-MALFUNCTION |
| 8 | H | L | H | |

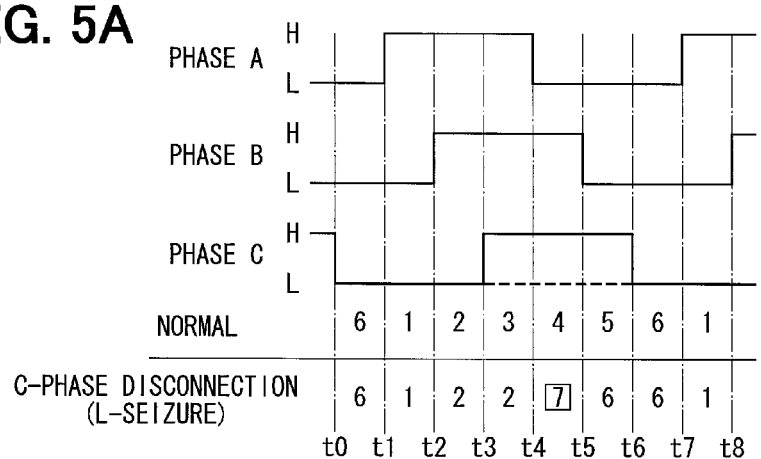
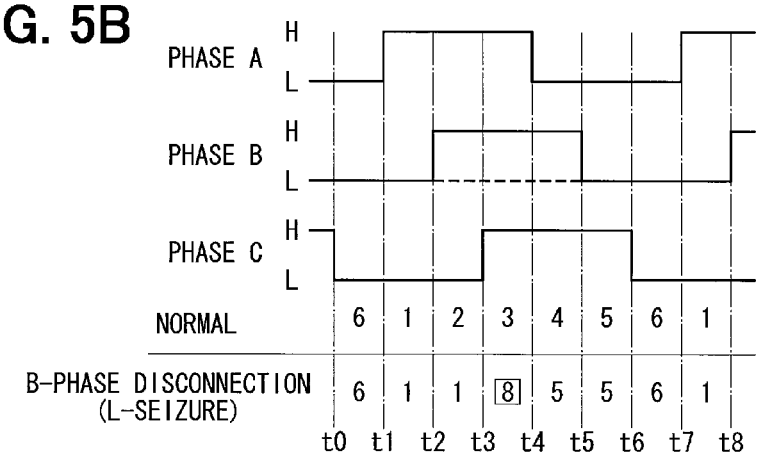
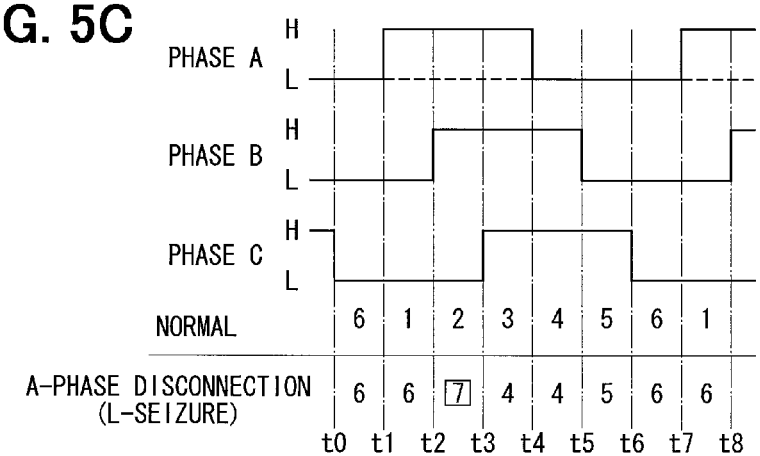

POSITION SENSING DEVICE, ROTATIONAL ACTUATOR HAVING THE SAME, SHIFT-BY-WIRE SYSTEM HAVING THE ROTATIONAL ACTUATOR, AND METHOD FOR DETECTING POSITION OF MOVABLE MEMBER

CROSS REFERENCE TO RELATED APPLICATION

This application is based on reference Japanese Patent Application No. 2011-212527 filed on Sep. 28, 2011, the disclosure of which is incorporated herein by reference.

TECHNICAL FIELD

The present disclosure relates to a position sensing device configured to detect the position of a movable member. The present disclosure further relates to a rotational actuator having the position sensing device. The present disclosure further relates to a shift-by-wire system having the rotational actuator. The present disclosure further relates to a method for detecting the position of the movable member.

BACKGROUND

A known position sensing device is configured to detect the position of a movable member according to pulse signals in multiple phases sent from an encoder accompanied with rotation of the movable member or accompanied with linear movement of the movable member. For example, JP-A-1-223311 discloses a position sensing device including an encoder equipped with a pulse output unit configured to send three-phase pulse signals with rotation or linear movement of a movable member. The three-phase pulse signals have a phase difference of 120 degrees thereamong. With this configuration of JP-A-1-223311, the encoder causes the pulse output unit to send the three-phase pulse signals with specific combination patterns. Herein, when a malfunction occurs in the pulse output unit, the three-phase pulse signals sent from the pulse output unit show a pattern (in-malfunction pattern) in which all the three-phase signals coincide with each other at the high level or at the low level.

The encoder of JP-A-1-223311 is configured to detect the pattern (in-malfunction pattern), in which all the three-phase pulse signals coincide with each other at the high level or at the low level, thereby to detect a malfunction in the pulse output unit. Nevertheless, it is noted that, the position sensing device of JP-A-1-223311 cannot continue detection of the movable member appropriately after a malfunction occurs in the pulse output unit of the encoder.

Herein, JP-A-1-223311 further discloses a servomotor equipped with the above-described encoder and a servomechanism equipped with the servomotor. In this servomechanism, the encoder is configured to send three-phase pulse signals with rotation of a sending screw rotated by the servomotor. The position sensing device is configured to detect the rotary position of the sending screw (machinery sending stand) according to the three-phase pulse signals. Rotation of the servomotor is feedback-controlled according to the rotary position detected with the position sensing device. Herein, in a case where a malfunction occurs in the pulse output unit of the encoder, the position sensing device cannot detect the rotary position correctly, and consequently, rotation of the servomotor cannot be continued. When rotation of the servomotor cannot be continued, it is impossible to drive the machinery sending stand of servomechanism.

SUMMARY

It is an object of the present disclosure to produce a position sensing device, a rotational actuator, and a shift-by-wire system, each configured to continue detection of the position of a movable member, even if a malfunction occurs in output of a pulse signal. It is another object of the present disclosure to produce a method for detecting the position of the movable member.

According to an aspect of the present disclosure, a position sensing device configured to detect a position of a movable member being rotatable or linearly movable, the position sensing device comprises a pulse signal output unit configured to send three-phase pulse signals, which have predetermined phase differences thereamong, according to a rotation or a linear movement of the movable member. The position sensing device further comprises a counter unit configured to store a count value and configured to add a first predetermined value to the count value or to subtract the first predetermined value from the count value and to add a second predetermined value to the count value or to subtract the second predetermined value, which is different from the first value, from the count value, according to an in-normal pattern, which is a combination of the pulse signals appearing when all the three-phase pulse signals are normal, and an in-malfunction pattern, which is a combination of the pulse signals appearing when one of the pulse signals among the three-phase pulse signals malfunctions. The position sensing device further comprises a position detection unit configured to detect the position of the movable member according to the count value.

According to another aspect of the present disclosure, a method for detecting a position of a movable member being rotatable or linearly movable, the method comprises sensing three-phase pulse signals, which are sent with a rotation or a linear movement of the movable member. The method further comprises determining that a combination of the pulse signals is in an in-normal pattern when all the three-phase pulse signals are normal. The method further comprises determining that the combination of the pulse signals is in an in-malfunction pattern when one of the three-phase pulse signals malfunctions. The method further comprises adding a first predetermined value to a count value or subtracting the first predetermined value from the count value, or adding a second predetermined value to the count value or subtracting the second predetermined value from the count value, according to the in-normal pattern and the in-malfunction pattern. The method further comprises acquiring the position of the movable member according to the count value.

BRIEF DESCRIPTION OF THE DRAWINGS

The above and other objects, features and advantages of the present invention will become more apparent from the following detailed description made with reference to the accompanying drawings. In the drawings:

FIGS. 5A, 5B, and 5C are chats each showing the three-phase pulse signals sent from the pulse signal output unit of the position sensing device according to one embodiment of the present disclosure, wherein FIG. 5A shows a case where a C phase causes seizure at an L level, FIG. 5B shows a case where a B phase causes seizure at the L level, and FIG. 5C shows a case where an A phase causes seizure at the L level;

FIGS. 6A, 6B, and 6C are chats each showing the three-phase pulse signals sent from the pulse signal output unit of the position sensing device according to one embodiment of the present disclosure, wherein FIG. 6A shows a case where the C phase causes seizure at the H level, FIG. 6B shows a case where the B phase causes seizure at the H level, and FIG. 6C shows a case where the A the phase causes seizure at the H level.

DETAILED DESCRIPTION

As follows, embodiments of the present disclosure will be described with reference to drawings.

(Embodiment)

Figure 1:
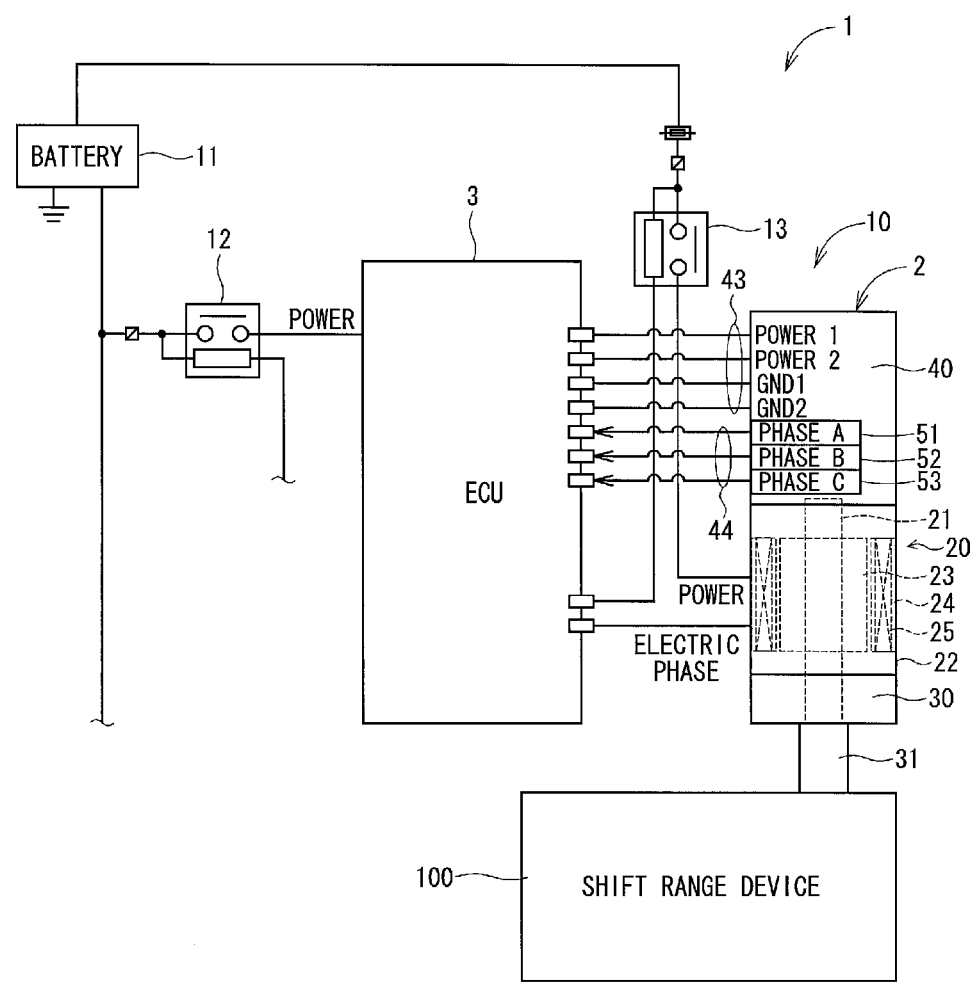
FIG. 1 is a schematic diagram showing a position sensing device, a rotational actuator, and a shift-by-wire system, according to an embodiment of the present disclosure.

FIG. 1 shows a position sensing device, a rotational actuator, and a shift-by-wire system, according to an embodiment of the present disclosure.

A shift-by-wire system 1 includes an electronic control unit (ECU) 3, a rotational actuator 10, a shift range switching device 100, and the like. The shift-by-wire system 1 is equipped to a vehicle with a transmission device, such as an automatic transmission device. The shift-by-wire system 1 is configured to drive the rotational actuator 10 and the shift range switching device 100 according to an instruction of a driver of the vehicle thereby to implement a by-wire control to manipulate the shift range of the automatic transmission device.

The ECU 3 is, for example, a small-size computer including a computation unit, a central processing unit (CPU), a RAM, a ROM, an input-output unit, a storage unit, and the like. The ECU 3 is configured to control various devices by executing various program products, which are stored in the ROM, according to signals sent from various sensors equipped to the vehicle and data stored in the ROM and the RAM. The ECU 3 is electrically connected through a relay device 12 with a battery 11, which is an electric power source of the vehicle.

Figure 3A:
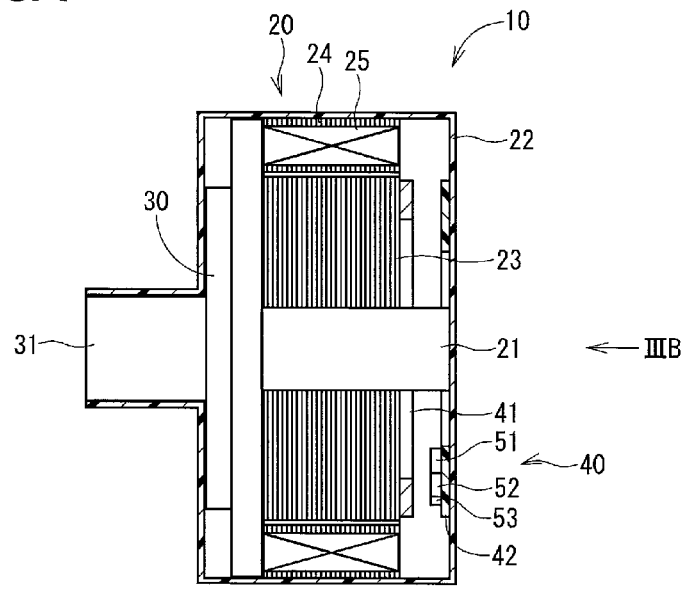
FIG. 3A is a sectional view showing the rotational actuator according to one embodiment of the present disclosure.

As shown in FIG. 3A, the rotational actuator 10 includes a motor shaft 21 as a movable member, a housing 22, a rotor 23, a stator 24, windings (coils) 25, reduction gears 30, an encoder 40 as a pulse signal output unit, and the like. The motor shaft 21 is a substantially circular column component formed of, for example, a metallic material. The housing 22 is a hollow tubular component with a bottomed end formed of, for example, a resin material. The housing 22 is relatively short in length in the axial direction. The housing 22 has a profile substantially in a disc shape. The housing 22 rotatably and coaxially accommodates the motor shaft 21. In other words, the housing 22 rotatably supports the motor shaft 21.

The rotor 23 is substantially in a cylindrical shape and formed of, for example, laminated steel plates. The motor shaft 21 is fitted to the inner wall of the rotor 23, and thereby the rotor 23 is integrated with the motor shaft 21. The present configuration enables the rotor 23 to rotate integrally with the motor shaft 21 relative to the housing 22. The stator 24 is substantially in an annular shape and formed of, for example, laminated steel plates. The stator 24 is affixed to the inner wall of the housing 22 and located on the radially outside of the rotor 23. The present configuration enables the rotor 23 to rotate integrally with the motor shaft 21 relative to the stator 24.

In the present embodiment, the windings 25 include multiple winding elements each being wound around corresponding one of multiple salient poles of the stator 24 each being projected radially inward. The motor shaft 21, the rotor 23, the stator 24, and the windings 25 form a motor portion 20. In the present embodiment, the motor portion 20 is a switched reluctance motor (SR motor) being a brushless motor configured to generate driving force without using a permanent magnet. The windings 25 correspond to multiple phases of the motor portion 20, respectively.

The windings 25 are electrically connected with the battery 11 through a relay device 13. Referring to FIG. 1, the ECU 3 is connected with the rotational actuator 10. The ECU 3 controls electric power supplied to the windings 25 from the battery 11. More specifically, the ECU 3 successively energizes the windings 25 corresponding to multiple phases at predetermined timings. The present configuration causes the stator 24 to generate a revolving magnetic field thereby to rotate the rotor 23 with the motor shaft 21. The reduction gears 30 are accommodated in the housing 22 and connected with the motor shaft 21. The reduction gears 30 include planetary gears (not shown) configured to reduce rotational speed of the motor shaft 21 and to cause an output shaft 31 to generate output power.

The encoder 40 is accommodated in the housing 22 and is located on the opposite side from the reduction gears 30 of the rotor 23. The encoder 40 is an incremental-type rotary encoder and configured to send a pulse signal according to rotation of the motor shaft 21, i.e., deviation in the rotation angle of the rotor 23. The ECU 3 detects the rotary position of the motor shaft 21 and the rotor 23 according to the pulse signal sent from the encoder 40. The present configuration enables the ECU 3 to detect the rotational state of the motor shaft 21 and the rotor 23, such as the rotative direction and the revolution. The ECU 3 implements feedback control on the detected rotational state of the rotor 23 thereby to control electric power supplied to the rotational actuator 10 to cause the rotor 23 to rotate at high rotational speed without losing steps. The ECU 3 may function as a rotation control unit. Configuration and operation of the encoder 40 will be described later in detail. Each time when the electric power source of the vehicle is activated to start the shift-by-wire system 1, an initial drive control is implemented to perform a magnetized and energized phase learning of the motor portion 20 to synchronize a pulse signal sent from the encoder 40 with an energized phase. The initial drive control enables appropriate control of rotation of the rotational actuator 10.

Figure 2:
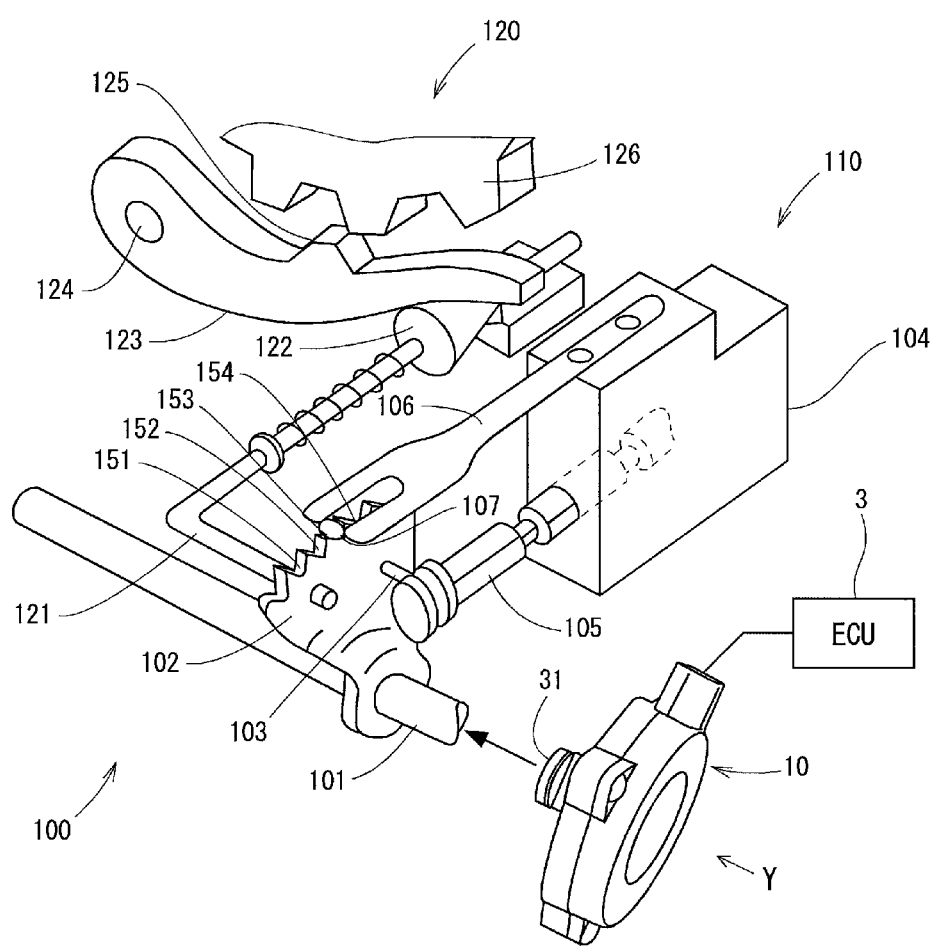
FIG. 2 is a perspective view showing a shift range switching device of the shift-by-wire system, according to an embodiment of the present disclosure.

As shown in FIG. 2, the shift range switching device 100 includes a shift range switching mechanism 110 and a parking switching mechanism 120. The shift range switching mechanism 110 is configured with a manual shaft 101, a detent plate 102, a hydraulic valve body 104, and the like. The manual shaft 101 is connected via a spline with the output shaft 31 of the rotational actuator 10 at one end. The detent plate 102 is in a sector shape and is extended from the manual shaft 101 radially outward. The detent plate 102 is configured to rotate integrally with the manual shaft 101. The detent plate 102 is equipped with a pin 103 projected in parallel with the manual shaft 101. The pin 103 is retained at an end of a manual spool valve 105 equipped to the hydraulic valve body 104. With the present configuration, the detent plate 102 is rotatable integrally with the manual shaft 101 thereby to render the manual spool valve 105 movable back and forth in the axial direction. The manual spool valve 105 is movable back and forth in the axial direction thereby to switchover hydraulic-pressure-supply channels relative to a hydraulic pressure clutch of an automatic transmission device (not shown). Consequently, an engagement state of the hydraulic pressure clutch is operated to manipulate the shift range of the automatic transmission device.

The detent plate 102 has a recess 151, a recess 152, a recess 153, and a recess 154 at the circumferential periphery. The recesses 151 to 154 correspond to, for example, shift ranges (not shown), such as a P range, an R range, an N range, and a D range, of the automatic transmission device, respectively. A detent roller 107 is supported at a tip end of a detent spring 106 and is configured to engage with one of the recesses 151 to 154 of the detent plate 102 thereby to position the manual spool valve 105 in the axial direction.

When the rotational actuator 10 applies torque to the detent plate 102 through the manual shaft 101, the detent roller 107 moves to an adjacent one of the recesses 151 to 154. In this way, the position of the manual spool valve 105 is manipulated in the axial direction. For example, when the manual shaft 101 is rotated in the clockwise direction relative to the direction viewed from the arrow Y in FIG. 2, the pin 103 pushes the manual spool valve 105 into the hydraulic valve body 104 via the detent plate 102. Thus, the hydraulic channels in the hydraulic valve body 104 are switched in the order corresponding to the D range, the N range, the R range, and the P range. Thus, the shift range of the automatic transmission device is switched in the order of the D range, the N range, the R range, and the P range.

Alternatively, when the manual shaft 101 is rotated in the counterclockwise direction, the pin 103 pulls the manual spool valve 105 from the hydraulic valve body 104 thereby to switch the hydraulic channels in the hydraulic valve body 104 in the order of the P range, the R range, the N range, and the D range. Thus, the shift range of the automatic transmission device is switched in the order of the P range, the R range, the N range, and the D range. In the present configuration, the rotation angle of the manual shaft 101 rotated by the rotational actuator 10 corresponds to each of the shift ranges of the automatic transmission device. When the rotational actuator 10 rotates the manual shaft 101 in the clockwise direction, the rotor 23 rotates in a forward direction. Alternatively, when the rotational actuator 10 rotates the manual shaft 101 in the counterclockwise direction, the rotor 23 rotates in a reverse direction.

The parking switching mechanism 120 is configured with a rod 121, a parking lock pole 123, a parking gear 126, and the like. The rod 121 is substantially in an L-shape and is connected with one end of the detent plate 102. A conical portion 122 is equipped to the other end of the rod 121. The rod 121 converts rotary motion of the detent plate 102 into linear motion thereby to move the conical portion 122 back and forth in the axial direction. The parking lock pole 123 is in contact with the lateral side of the conical portion 122. Therefore, as the rod 121 moves back and forth, the parking lock pole 123 is rotated around a shaft portion 124. The parking lock pole 123 is equipped with a projected portion 125 projected in the rotative direction. When the projected portion 125 is engaged with the parking gear 126, rotation of the parking gear 126 is regulated. In this way, the driving wheel of the vehicle is locked via a drive shaft, a differential gear, and/or the like (not shown). Alternatively, when the projected portion 125 of the parking lock pole 123 is released from the parking gear 126, rotation of the parking gear 126 is permitted, and the lock of the driving wheel is released.

Figure 3B:
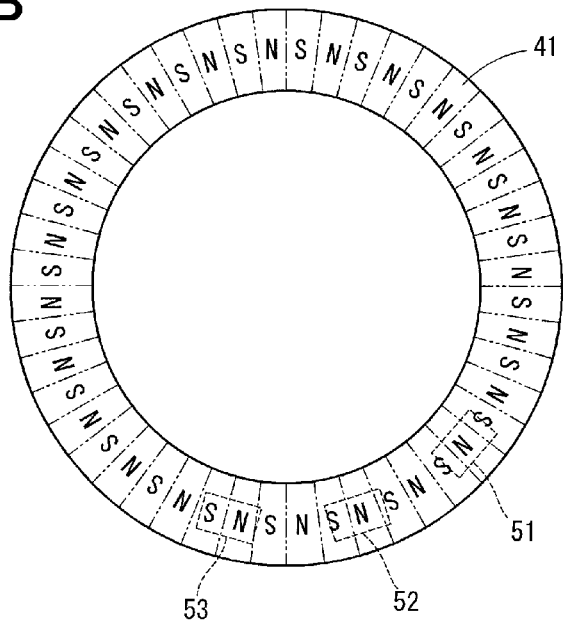
FIG. 3B is a view when being viewed from the arrow IIIB and showing a part of the position sensing devices according to one embodiment of the present disclosure.

Subsequently, the configuration and the operation of the encoder 40 will be described in detail. As shown in FIG. 3A, the encoder 40 includes a magnet plate 41, a circuit board 42, a hall IC device 51, and the like. The magnet plate 41 may function as a magnetic field generator unit. The hall IC device 51 may function as a magnetism detection unit. As shown in FIG. 3A and FIG. 3B, the magnet plate 41 is in an annular plate shape and is fixed to an end surface of the rotor 23 on the opposite side from the reduction gears 30. The magnet plate 41 is coaxial with the rotor 23. With the present configuration, the magnet plate 41 is rotatable with the rotor 23.

As shown in FIG. 3B, the magnet plate 41 is magnetized with N poles and S poles alternately at regular intervals in the circumferential direction. In the present embodiment, the number of magnetization of the N poles is 24, and the number of magnetization of the S poles is also 24. The circuit board 42 is an annular plate-shape component formed of, for example, a resin material. The circuit board 42 is fixed to the inner wall of the housing 22 and is opposed to the magnet plate 41. With the present configuration, the magnet plate 41 is rotatable relative to the circuit board 42, as the rotor 23 rotates.

The hall IC devices 51 to 53 are arranged in the circumferential direction at predetermined intervals respectively at predetermined locations on the surface of the circuit board 42 on the side of the magnet plate 41. With the present configuration, the hall IC devices 51 to 53 are opposed to the magnet plate 41. The physical relationship between the magnet plate 41 and the hall IC devices 51 to 53 is shown in FIG. 3B.

Referring to FIG. 1, the encoder 40 is equipped with power lines 43 electrically connecting the hall IC devices 51 to 53 with the ECU 3. With the present configuration, the hall IC devices 51 to 53 are supplied with electric power from the battery 11 through the ECU 3 and the power lines 43. Each of the hall IC devices 51 to 53 includes a hall element configured to generate a voltage according to the direction and the magnitude of a magnetic field there around. In the present embodiment, each of the hall IC devices 51 to 53 is configured to send a signal at a low level (L level) to the ECU 3, when the voltage generated by the hall element is less than or equal to a predetermined value. Alternatively, each of the hall IC devices 51 to 53 is configured to send a signal at a high level (H level) to the ECU 3, when the voltage generated by the hall element is greater than the predetermined value.

As the magnet plate 41 rotates together with the rotor 23, the direction and the magnitude of the magnetic field around the hall IC devices 51 to 53 changes. With the present configuration, the hall IC devices 51 to 53 send pulse signals each repeatedly shifting between the low level and the high level alternately. In the present embodiment, the hall IC devices 51 to 53 send the pulse signals including 24 pairs of the L-level signal and the H-level signal for each rotation of the magnet plate 41 and the rotor 23. One cycle of the pulse signal relates to the rotation of the magnet plate 41 and corresponds to 15 degrees in the mechanical angle. The mechanical angle is a mechanical rotation angle relative to 360 degrees corresponding to one rotation of the magnet plate 41 and the rotor 23.

Referring to FIG. 1, the encoder 40 is equipped with signal lines 44 electrically connecting the hall IC devices 51 to 53 with the ECU 3. With the present configuration, the pulse signals sent from the encoder 40 (hall IC devices 51 to 53) are transmitted to the ECU 3 through the signal lines 44 when the magnet plate 41 and the rotor 23 rotate. More specifically, the encoder 40 sends three-phase pulse signals at predetermined phase differences correspondingly to rotation of the motor shaft 21 and the rotor 23 (movable members).

Figures 4A, 4B:
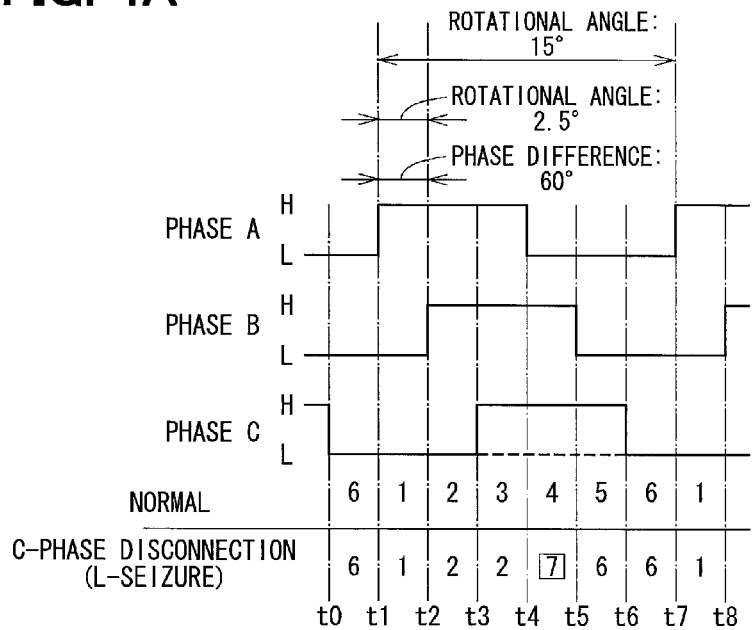
FIG. 4A is chart showing three-phase pulse signals sent from a pulse signal output unit of the position sensing device according to one embodiment of the present disclosure.
FIG. 4B is a view showing a combination pattern of the three-phase pulse signals.

In the present embodiment, the hall IC devices 51 to 53 are arranged at predetermined locations on the circuit board 42, respectively. With the present configuration, as shown in FIG. 4A, the encoder 40 (hall IC devices 51 to 53) sends the pulse signals having a predetermined phase difference therebetween. In the present example, the hall IC device 51 sends the pulse signal in an A phase, the hall IC device 52 sends the pulse signal in a B phase, and the hall IC device 53 sends the pulse signal in a C phase. As shown in FIG. 4A, the phase difference between the phases is 60 degrees in electric angle and is 2.5 degrees in mechanical angle. Therefore, each time when the magnet plate 41 rotates by 2.5 degrees, the combination of the L level and the H level shows a different pattern. The electric angle is an angle relative to one cycle (360 degrees) of generation of the pulse signal in each phase.

As shown in FIG. 4B, the combinations of the L-level signal and the H-level signal in each phase include the pattern 1 to the pattern 8. FIG. 4A shows a state where all the hall IC devices 51 to 53 itself, the electric power supply paths between the hall IC devices 51 to 53 and the ECU 3, and the signal transmission paths between the hall IC devices 51 to 53 and the ECU 3 are normal, i.e., stable. In this state, according to the present embodiment, the combinations of the L-level signal and the H-level signal in each phase show patterns 1 to 6. In FIG. 4A, each of t0 to t8 corresponds to leading (rising) or trailing (falling) of one of the pulse signals in the phases. In the present embodiment, when the rotor 23 performs forward rotation, the patterns 1 to 6 appear in order at t1 to t7 respectively.

The ECU 3 holds, i.e., stores a count value in the RAM. The count value is reset to 0 as an initial value when the shift-by-wire system 1 is activated, and electricity supply to the ECU 3 is started. The ECU 3 detects one of the patterns (pattern numbers) corresponding to the present state at each of t0 to t8, according to the pulse signals sent from the hall IC devices 51 to 53. When the pattern number increases by 1 compared with the previous detection, or when the pattern number changes from 6 to 1, the ECU 3 adds 1 as a first predetermined value to a count value. Alternatively, when the pattern number decreases by 1 compared with the previous detection, or when the pattern number changes from 1 to 6, the ECU 3 subtracts 1 as the first predetermined value from the count value. The ECU 3 may function as a counter unit.

With the above-described configuration, when the rotor 23 performs, for example, forward rotation, the count value is incremented by 1 at the time point of leading or trailing of the pulse signal in each phase. Alternatively, when the rotor 23 performs, for example, reverse rotation, the count value is decremented by 1 at the time point of leading or trailing of the pulse signal in each phase. The present configuration enables the ECU 3 to detect the rotary position related to rotation of the rotor 23 and the motor shaft 21 according to the count value.

That is, when the count value increases by a predetermined value, the ECU 3 recognizes rotation of the rotor 23 and the motor shaft 21 in the forward direction by an angle corresponding to the predetermined value. Alternatively, when the count value decreases by a predetermined value, the ECU 3 recognizes rotation of the rotor 23 and the motor shaft 21 in the reverse direction by an angle corresponding to the predetermined value. The ECU 3 may function as a position detection unit. The position sensing device 2 is configured with the encoder 40 and the ECU 3.

Referring to FIG. 4B, it is conceivable that one of the hall IC devices 51 to 53 itself, the electric power supply paths between the hall IC devices 51 to 53 and the ECU 3, and the signal transmission paths between the hall IC devices 51 to 53 and the ECU 3 may cause a disorder, i.e., malfunction. In this state, the combinations of the L-level signal and the H-level signal in each phase show patterns 7, 8, other than the patterns 1 to 6. For example, it is conceivable that an OFF malfunction such as disconnection may occur in the path such as the lead wire between the hall IC device 53 (C phase) and the ECU 3. In this case, as shown by the dotted lime in FIG. 4A, the hall IC device 53 (C phase) sends only the signals at the low level (L level) to cause L seizure. Therefore, the pattern 7 (A phase: L level, B phase: H level, C phase: L level) appears between t4 and t5.

Referring to FIG. 5B, when an OFF malfunction such as disconnection occurs in the path such as the lead wire between the hall IC device 52 (B phase) and the ECU 3, the pattern 8 (A phase: H level, B phase: L level, C phase: H level appears between t3 and t4. Referring to FIG. 5C, when an OFF malfunction such as disconnection occurs in the path such as the lead wire between the hall IC device 51 (A phase) and the ECU 3, the pattern 7 (A phase: L level, B phase: H level, C phase: L level appears between t2 and t3.

Figure 6A:
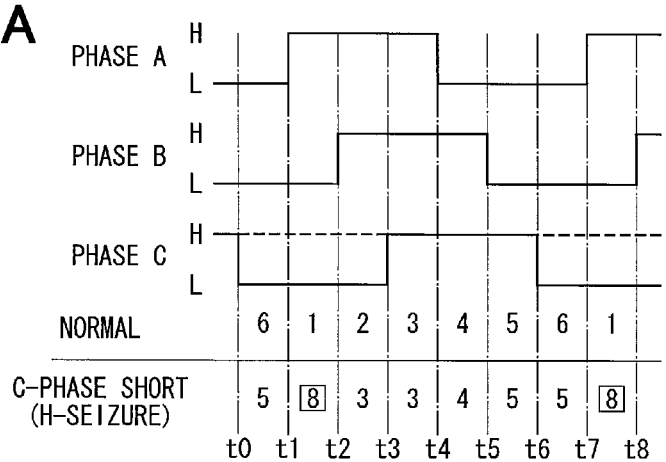

For example, it is conceivable that an ON malfunction such as shortcircuit may occur in the path such as the lead wire between the hall IC device 53 (C phase) and the ECU 3. In this case, as shown by the dotted lime in FIG. 6A, the hall IC device 53 (C phase) sends only the signals at the high level (H level) to cause H seizure. Therefore, the pattern 8 (A phase: H level, B phase: L level, C phase: H level) appears between t1 and t2 and between t7 and t8.

Figure 6B:
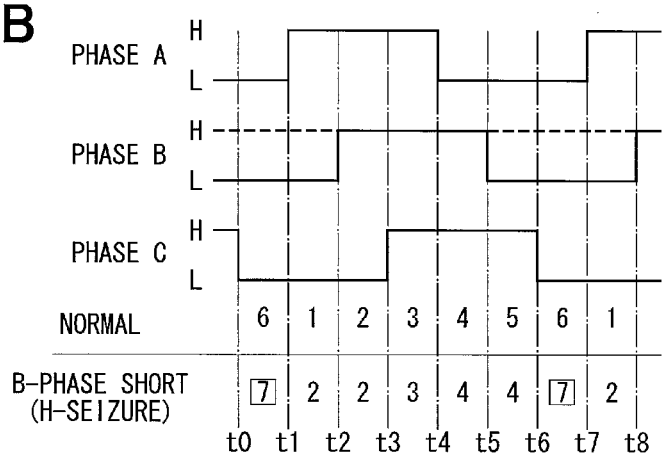
Figure 6C:
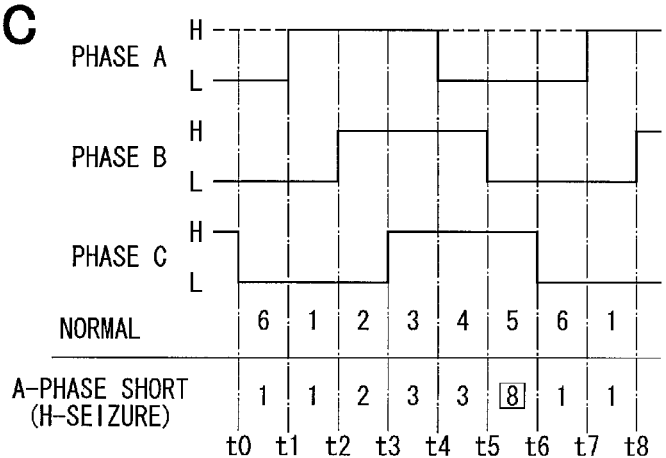

Referring to FIG. 6B, when an ON malfunction such as shortcircuit occurs in the path such as the lead wire between the hall IC device 52 (B phase) and the ECU 3, the pattern 7 (A phase: L level, B phase: H level, C phase: L level appears between t0 and t1 and between t6 and t7. Referring to FIG. 6C, when an ON malfunction such as shortcircuit occurs in the path such as the lead wire between the hall IC device 51 (A phase) and the ECU 3, the pattern 8 (A phase: H level, B phase: L level, C phase: H level appears between t5 and t6.

Hereby, it is defined that the patterns 1 to 6, which appear when the encoder 40 is normal, as an in-normal pattern, and it is defined that the patterns 7 and 8, which appear only when a malfunction occurs in a part of the encoder 40, as an in-malfunction pattern. The ECU 3 detects a malfunction of the encoder 40 by detecting the in-malfunction pattern (patterns 7 and 8). In addition, the ECU 3 detects which one of the A-C phases of the encoder 40 causes a malfunction according to the signals sent from the hall IC devices 51 to 53 and the pattern appearing in the signals. The ECU 3 may function as a malfunction detection unit.

FIGS. 5A to 5C and FIGS. 6A to 6C show the fact that the identical in-normal patterns certainly appear twice continuously in each of the adjacent sides of the in-malfunction pattern (patterns 7 and 8) when a part of the encoder 40 causes a malfunction. Therefore, in the present embodiment, the ECU 3 adds 2 to or subtract 2 from, as a second predetermined value, the count value when the pattern, which is detected at the time point of leading or trailing of a pulse, changes from the in-normal pattern to the in-malfunction pattern or changes from the in-malfunction pattern to the in-normal pattern. That is, the ECU 3 functions as a counter unit.

More specifically, for example, as shown in FIG. 4A, in the state where the rotor 23 performs forward rotation, when the pattern 2 (in-normal pattern) changes to the pattern 7 (in-malfunction pattern) at t4, the ECU 3 adds 2 as the second predetermined value to the count value. In addition, when the pattern 7 (in-malfunction pattern) changes to the pattern 6 (in-normal pattern) at t5, the ECU 3 adds 2 as the second predetermined value to the count value. Alternatively, for example, in the state where the rotor 23 performs reverse rotation, when the pattern 6 (in-normal pattern) changes to the pattern 7 (in-malfunction pattern) at t5, the ECU 3 subtracts 2 as the second predetermined value from the count value. In addition, when the pattern 7 (in-malfunction pattern) changes to the pattern 2 (in-normal pattern) at t4, the ECU 3 subtracts 2 as the second predetermined value from the count value.

With the above-described method, the ECU 3 according to the present embodiment is configured to function as the position detection unit to continue detection of the rotary position of the rotor 23 and the motor shaft 21, even if a malfunction occurs in a part of the encoder 40. In addition, the ECU 3 is configured to determine whether the rotative direction of the rotor 23 and the motor shaft 21 is the forward direction or the reverse direction, according to the order of appearance of the in-normal pattern and the in-malfunction pattern, even in a state where a malfunction occurs in a part of the encoder 40, in addition to the state where the encoder 40 is normal (in order).

Figure 7:
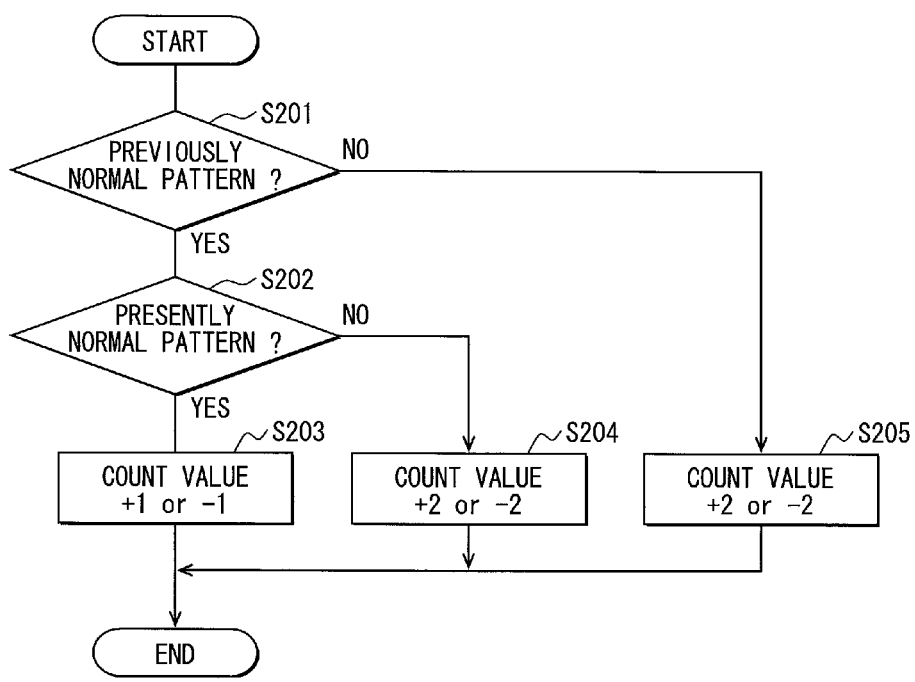
FIG. 7 is a flowchart showing a processing of a counter unit of the position sensing device according to one embodiment of the present disclosure.

Subsequently, a processing flow of the ECU 3 according to the present embodiment when functioning as the counter unit as described above, will be described with reference to FIG. 7. The series of processings shown in FIG. 7 is repeatedly implemented at each time point of leading and trailing of the three-phase pulse signals transmitted from the encoder 40 to the ECU 3. For example, the series of processings shown in FIG. 7 is repeatedly implemented at each of t0 to t8 in FIG. 4A.

At S201, the ECU 3 determines whether the pattern detected at the previous time is the in-normal pattern. When the pattern detected at the previous time is the in-normal pattern (S201: YES), the processing proceeds to S202. Alternatively, when the pattern detected at the previous time is not the in-normal pattern, i.e., when the pattern is the in-malfunction pattern (S201: NO), the processing proceeds to S205.

At S202, the ECU 3 determines whether the pattern detected at the present time is the in-normal pattern. When the pattern detected at the present time is the in-normal pattern (S202: YES), the processing proceeds to S203. Alternatively, when the pattern detected at the present time is not the in-normal pattern, i.e., when the pattern is the in-malfunction pattern (S202: NO), the processing proceeds to S204.

At S203, the ECU 3 adds 1 to the count value or subtracts 1 from the count value. More specifically, when the pattern number increases by 1 compared with the previous detection, or when the pattern number changes from 6 to 1, the ECU 3 adds 1 to the count value. Alternatively, when the pattern number decreases by 1 compared with the previous detection, or when the pattern number changes from 1 to 6, the ECU 3 subtracts 1 from the count value.

At S204, the ECU 3 adds 2 to the count value or subtracts 2 from the count value. More specifically, the ECU 3 adds 2 to the count value on determination that the rotative direction of the rotor 23 is the forward direction according to the order of appearance of the immediately preceding patterns. Alternatively, the ECU 3 subtracts 2 from the count value on determination that the rotative direction of the rotor 23 is the reverse direction.

At S205, the ECU 3 adds 2 to the count value or subtracts 2 from the count value. More specifically, the ECU 3 adds 2 to the count value on determination that the rotative direction of the rotor 23 is the forward direction according to the order of appearance of the immediately preceding patterns. Alternatively, the ECU 3 subtracts 2 from the count value on determination that the rotative direction of the rotor 23 is the reverse direction. The series of processings at S201 to S205 enables the ECU 3 to update the count value arbitrary and to continue detection of the rotary position of the rotor 23 and the motor shaft 21, even if a malfunction occurs in a part of the encoder 40.

As described above, the ECU 3 according to the present embodiment is configured to add 1 as the first predetermined value or 2 as the second predetermined value to the count value or to subtract 1 as the first predetermined value or 2 as the second predetermined value from the count value. In this way, the ECU 3 is configured to detect the rotary position of the motor shaft 21 according to change in the count value, even if a pulse signal in one phase among the three-phase pulse signals sent from the encoder 40 causes a malfunction. Therefore, the ECU 3 according to the present embodiment is enabled to continue detection of the rotary position of the motor shaft 21, even when a part of the encoder 40 malfunctions. In addition, the ECU 3 is configured to detect change in the detected rotary position of the motor shaft 21 with time, thereby to detect the rotational state of the motor shaft 21 such as the rotative direction and the revolution.

In the present embodiment, the ECU 3 adds 1 as the first predetermined value to the count value or subtracts 1 as the first predetermined value from the count value in response to change from a predetermined in-normal pattern to another in-normal pattern, as the motor shaft 21 rotates. In addition, the ECU 3 adds 2 as the second predetermined value to the count value or subtracts 2 as the second predetermined value from the count value in response to change from the in-normal pattern to the in-malfunction pattern or change from the in-malfunction pattern to the in-normal pattern. That is, the ECU 3 according to the present embodiment adds 2 as the second predetermined value to the count value or subtracts 2 as the second predetermined value from the count value, instead of 1 as the first predetermined value, in response to change in the pattern including the in-malfunction pattern. In this way, the ECU 3 is enabled to continue detection of the rotary position of the motor shaft 21, even when a part of the encoder 40 malfunctions.

In addition, the position sensing device according to the present embodiment further includes the malfunction detection unit configured to detect the in-malfunction pattern thereby to detect a malfunction of the encoder 40. The present configuration enables recognition that a part the position sensing device 2 (encoder 40) malfunctions.

The rotational actuator 10 of the present embodiment includes the above-described position sensing device 2 configured with the encoder 40 and the ECU 3. As described above, the position sensing device 2 is enabled to continue detection of the rotary position of the motor shaft 21, even when a part of the encoder 40 malfunctions. Therefore, the present configuration enables to continue rotation of the rotor 23 and the rotational actuator 10, even when a part of the position sensing device 2 including the encoder 40 malfunctions.

In addition, the shift-by-wire system 1 of the present embodiment includes the above-described rotational actuator 10. As described above, the rotational actuator 10 enables to continue its rotation, even when a part of the position sensing device 2 including the encoder 40 malfunctions. Therefore, the present configuration enables to switch the shift range of the automatic transmission device, even when a part of the position sensing device 2 including the encoder 40 malfunctions.

(Other Embodiment)

In the above-described embodiment, a pulse signal generation unit (magnetic rotary encoder) includes the magnetic field generator unit (magnet plate), which is equipped to the movable member (motor shaft) and rotatable, and the magnetism detection unit (hall IC device), which is rotatable relative to the magnetic field generator unit. Thus, the pulse signal generation unit is configured to send the three-phase pulse signals with the predetermined phase difference thereamong, in response to rotation of the movable member. Alternatively, according to the other embodiment of the present disclosure, a pulse signal generation unit (magnetic linear encoder) may be configured with a magnetic field generator unit, which is equipped to the movable member and linearly movable, and a magnetism detection unit, which is displaceable relative to the magnetic field generator unit. In this case, the pulse signal generation unit may be configured to send three-phase pulse signals with a predetermined phase difference thereamong, in response to linear movement of the movable member. In a configuration where the magnetic field generator unit and the magnetism detection unit are relatively rotatable or relatively displaceable, the magnetism detection unit may be equipped to the movable member.

According to another embodiment of the present disclosure, a pulse signal generation unit (optical rotary encoder) may be configured with, for example, a disk, which has multiple slits in its circumferential direction and is equipped to a movable member (motor shaft), a luminescent unit, which is equipped to one side of the disk and configured to emit light, and a photoreceiver unit, which is equipped to the other side of the disk and configured to receive light from the luminescent unit. In this case, the pulse signal generation unit may be configured to send three-phase pulse signals with predetermined phase difference thereamong, in response to rotation of the movable member. Alternatively, a pulse signal generation unit (optical linear encoder) may be configured with, for example, a plate, which has multiple slits in its movable direction and is equipped to a movable member, a luminescent unit, which is equipped to one side of the plate and configured to emit light, and a photoreceiver unit, which is equipped to the other side of the plate and configured to receive light from the luminescent unit. In this case, the pulse signal generation unit may be configured to send three-phase pulse signals with predetermined phase difference thereamong, in response to linear movement of the movable member.

In the above embodiment, the first predetermined value is set to 1, and the second predetermined value is set to 2. Alternatively, according to another embodiment of the present disclosure, the first predetermined value and the second predetermined value may be set to other values, respectively, as long as the first predetermined value and the second predetermined value are different from each other. The second predetermined value may be preferably twice as the first predetermined value.

According to another embodiment of the present disclosure, the number of magnetization of the N poles and the S poles on the magnet plate is not limited to 24 and may be another value.

According to another embodiment of the present disclosure, instead of the hall IC device, for example, a magnetic sensor configured with a magnetoresistive element or the like may be employed.

According to the other embodiment of the present disclosure, a motor other than the SR motor may be employed as the motor portion of the rotational actuator.

According to another embodiment of the present disclosure, the position sensing device may be employed for detecting the position of a movable member, such as a valve device of a vehicle. Alternatively, the position sensing device may be employed for detecting the position of a movable member, such as an industrial robot or a machine tool.

The rotational actuator is not limited to be employed as an actuating unit for a shift-by-wire system. According to another embodiment of the present disclosure, the rotational actuator may be employed for driving a movable member, such as a valve device of a vehicle. Alternatively, the rotational actuator may be employed for driving a movable member, such as an industrial robot or a machine tool.

The above-described position sensing device, which is configured to detect the rotation or the linear position of the movable member, may include the pulse signal output unit, the counter unit, and the position detection unit. The pulse signal output unit may be configured to send the three-phase pulse signals, which include predetermined phase differences thereamong, according to the rotation or the linear movement of the movable member. The counter unit may be configured to store the count value and: to add the first predetermined value to the count value or to subtract the first predetermined value from the count value; and to add the second predetermined value to the count value or to subtract the second predetermined value from the count value, the second value being different from the first value, according to: the in-normal pattern, which is the combination of the pulse signals appearing when all the three-phase pulse signals are normal; and the in-malfunction pattern, which is the combination of the pulse signals appearing when one of the pulse signals among the three-phase pulse signals causes a malfunction, the pulse signals being sent from the pulse signal output unit. Herein, it is conceivable that the pulse signals cause a malfunction in a case where, for example, a part of the circuit of the pulse signal output unit causes a disconnection (OFF malfunction) to cause the L seizure in which the pulse signal is seized at the low level, or a part of the circuit of the pulse signal output unit causes a shortcircuit (ON malfunction) to cause the H seizure in which the pulse signal is seized at the high level. For example, it is conceivable that the first predetermined value may be set to 1, and the second predetermined value may be set to 2. The position detection unit may be configured to detect the position of the movable member according to the count value, to which the counter unit is added or from which the count value is subtracted.

According to the present disclosure, the position sensing device is configured to: add the first predetermined value or the second predetermined value to the count value; or to subtract the first predetermined value or the second predetermined value from the count value. In this way, the position sensing device is configured to detect the rotary position of the movable member according to change in the count value, even if a pulse signal in one phase among the three-phase pulse signals sent from the pulse signal output unit causes a malfunction. Therefore, the position sensing device according to the present embodiment is enabled to continue detection of the rotary position of the movable member, even when a part of the pulse signal output unit malfunctions. In addition, the position detection unit is configured to detect change in the detected position of the movable member with time, thereby to detect the rotational state or the revolution of the movable member, such as the rotative direction, and/or the moving state, such as the moving direction and the moving speed.

The counter unit may be configured, in a state where the movable member rotates or linearly moves, to add the first predetermined value to the count value or to subtract the first predetermined value from the count value, when the in-normal pattern changes to another in-normal pattern changes. In addition, the counter unit may be configured, in a state where the movable member rotates or linearly moves, to add the second predetermined value to the count value or to subtract the second predetermined value from the count value, when the in-normal pattern changes to the in-malfunction pattern or when the in-malfunction pattern changes to the in-normal pattern. That is, the position sensing device according to the present disclosure may add the second predetermined value to the count value or may subtract the second predetermined value from the count value, instead of the first predetermined value, in response to change in the pattern including the in-malfunction pattern. With the present configuration, the position sensing device according to the present disclosure is enabled to continue detection of the position of the movable member, even when a part of the pulse signal output unit malfunctions.

The position sensing device according to the present disclosure may further include the malfunction detection unit configured to detect the in-malfunction pattern thereby to detect a malfunction of the pulse signal output unit. The present configuration enables recognition that a part the position sensing device (pulse signal output unit) malfunctions.

The rotational actuator may be equipped with the position sensing device and the rotation control unit. The housing may support the movable member rotatably. The rotor may be integrated with the movable member and may be rotatable relative to the housing. The stator may be affixed to the housing and located at the radially outside of the rotor. The winding may be wound around the stator. The rotation control unit may be configured to control an electric power supplied to the winding according to the rotary position of the movable member detected with the position sensing device thereby to control rotation of the rotor.

According to the present disclosure, the motor may be configured with the movable member, the rotor, the stator, and the winding. The movable member may include the motor shaft of the motor. The rotor, the stator, and the winding form a magnetic circuit, when the winding is supplied with an electric power, thereby to rotate the rotor integrated with the motor shaft. Thus, the motor shaft rotates as the movable member to generate a torque. The position sensing device may be configured to detect the rotary position of the movable member. The rotation control unit may be configured to detect the rotary position of the rotor according to the rotary position of the movable member thereby to control an electric power supplied to the winding according to the detected rotary position of the rotor. That is, the rotation control unit may be configured to implement a feedback control thereby to continue rotation of the rotor (rotational actuator).

As described above, the position sensing device according to the present disclosure is enabled to continue detection of the rotary position of the movable member, even when a part of the pulse signal output unit malfunctions. Therefore, the present configuration enables to continue rotation of the rotor and the rotational actuator, even when a part of the position sensing device including the pulse signal output unit malfunctions.

In the above-described shift-by-wire system equipped with the rotational actuator and the shift range switching device, the shift range switching device may be connected to the movable member (motor shaft) of the rotational actuator and may be configured to rotate the movable member thereby to switch the shift range of the automatic transmission device.

As described above, the rotational actuator enables to continue its rotation, even when a part of the position sensing device including the pulse signal output unit malfunctions. Therefore, the present configuration enables to switch the shift range of the automatic transmission device, even when a part of the position sensing device including the pulse signal output unit malfunctions.

The above structures of the embodiments can be combined as appropriate. The above processings such as calculations and determinations are not limited being executed by the ECU 3. The control unit may have various structures including the ECU 3 shown as an example.

The above processings such as calculations and determinations may be performed by any one or any combinations of software, an electric circuit, a mechanical device, and the like. The software may be stored in a storage medium, and may be transmitted via a transmission device such as a network device. The electric circuit may be an integrated circuit, and may be a discrete circuit such as a hardware logic configured with electric or electronic elements or the like. The elements producing the above processings may be discrete elements and may be partially or entirely integrated.

It should be appreciated that while the processes of the embodiments of the present disclosure have been described herein as including a specific sequence of steps, further alternative embodiments including various other sequences of these steps and/or additional steps not disclosed herein are intended to be within the steps of the present disclosure.

While the present disclosure has been described with reference to preferred embodiments thereof, it is to be understood that the disclosure is not limited to the preferred embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. A position sensing device configured to detect a position of a movable member being rotatable or linearly movable, the position sensing device comprising:
    a pulse signal output unit configured to send three-phase pulse signals, which have predetermined phase differences thereamong, according to a rotation or a linear movement of the movable member;
    a counter unit configured to store a count value and configured
        to add a first predetermined value to the count value or to subtract the first predetermined value from the count value and
        to add a second predetermined value to the count value or to subtract the second predetermined value, which is different from the first value, from the count value, according to
        an in-normal pattern, which is a combination of the pulse signals appearing when all the three-phase pulse signals are normal, and
        an in-malfunction pattern, which is a combination of the pulse signals appearing when one of the pulse signals among the three-phase pulse signals malfunctions; and a position detection unit configured to detect the position of the movable member according to the count value, wherein the counter unit is further configured to add the first predetermined value to the count value or to subtract the first predetermined value from the count value, when the movable member rotates or linearly moves and when the in-normal pattern changes to another in-normal pattern, and to add the second predetermined value to the count value or to subtract the second predetermined value from the count value, when the in-normal pattern changes to the in-malfunction pattern or when the in-malfunction pattern changes to the in-normal pattern.

2. The position sensing device according to claim 1, further comprising:

a malfunction detection unit configured to detect the in-malfunction pattern thereby to detect a malfunction of the pulse signal output unit.

3. A rotational actuator comprising:

the movable member;

a housing configured to support the movable member rotatably;

a rotor integrated with the movable member and rotatable relative to the housing;

a stator affixed to the housing and located at a radially outside of the rotor;

a winding wound around the stator;

the position sensing device according to claim 1; and a rotation control unit configured to control an electric power supplied to the winding according to a rotary position of the movable member detected with the position sensing device thereby to control rotation of the rotor.

4. A shift-by-wire system comprising:

the rotational actuator according to claim 3; and a shift range switching device connected to the movable member and configured to rotate the movable member thereby to switch a shift range of an automatic transmission device.

* * * * *